(12) United States Patent
Willner et al.

(10) Patent No.: US 10,340,946 B2
(45) Date of Patent: Jul. 2, 2019

(54) ENCODERS, DECODERS, AND METHODS

(71) Applicant: GURULOGIC MICROSYSTEMS OY, Turku (FI)

(72) Inventors: Kai Willner, Lempäälä (FI); Ossi Kalevo, Akaa (FI)

(73) Assignee: Gurulogic Microsystems Oy (FI)

( * ) Notice: Subject to any disclaimer, the term of this patent is extended or adjusted under 35 U.S.C. 154(b) by 0 days.

(21) Appl. No.: 15/771,370

(22) PCT Filed: Nov. 1, 2016

(86) PCT No.: PCT/EP2016/025133
§ 371 (c)(1),
(2) Date: Apr. 26, 2018

(87) PCT Pub. No.: WO2017/071826
PCT Pub. Date: May 4, 2017

(65) Prior Publication Data
US 2019/0097650 A1 Mar. 28, 2019

(30) Foreign Application Priority Data

Nov. 1, 2015 (GB) .................................. 1519297.4

(51) Int. Cl.
*H03M 7/34* (2006.01)
*H03M 7/40* (2006.01)
*H03M 7/30* (2006.01)

(52) U.S. Cl.
CPC ....... *H03M 7/4043* (2013.01); *H03M 7/6005* (2013.01); *H03M 7/6035* (2013.01)

(58) Field of Classification Search
CPC .......................... H03M 7/6065; H03M 7/4043
(Continued)

(56) References Cited

U.S. PATENT DOCUMENTS 3,394,352 A 7/1968 Wernikoff
5,680,129 A 10/1997 Weinberger et al.
(Continued)

FOREIGN PATENT DOCUMENTS

CN 102986221 A 3/2013
EP 0 166 607 A2 1/1986
(Continued)

OTHER PUBLICATIONS

Patents Act 1977: Search Report under Section 17 issued in Application No. GB1519297.4 dated Jul. 1, 2016.
(Continued)

*Primary Examiner* — Peguy Jean Pierre
(74) *Attorney, Agent, or Firm* — Eric L. Sophir; Dentons US LLP

(57) ABSTRACT

An encoder for encoding input data to generate corresponding encoded data is provided. The encoder (10) is operable to process a sequence of elements in the input data from a first element thereof to a last element thereof. The elements have corresponding symbols. The encoder is operable to compute probabilities of symbols present in the sequence, wherein the probabilities of the symbols are computed while disregarding those elements of the sequence that have already been encoded into the encoded data. Moreover, the probabilities of the symbols are adaptively changed as the sequence of elements is progressively encoded into the encoded data. Furthermore, information describing the probabilities is delivered; optionally, the probabilities of the symbols are accompanied with additional information indicating how the probabilities are adaptively changing. There is also provided a decoder for performing an inverse of encoding performed by the encoder.

37 Claims, 3 Drawing Sheets

(58) Field of Classification Search
USPC .............................. 341/50, 51, 107, 65, 67
See application file for complete search history.

(56) References Cited

U.S. PATENT DOCUMENTS

| | | | |
|---|---|---|---|
| 6,590,936 B1 | 7/2003 | Kadono | |
| 7,786,907 B2* | 8/2010 | Monro | H03M 7/30 341/107 |
| 9,615,108 B2* | 4/2017 | Sole | H04N 19/61 |
| 2005/0012648 A1 | 1/2005 | Marpe et al. | |
| 2007/0046504 A1* | 3/2007 | Ridge | H04N 19/176 341/50 |
| 2011/0310982 A1 | 12/2011 | Yang et al. | |
| 2013/0147843 A1 | 6/2013 | Shimizu | |

FOREIGN PATENT DOCUMENTS

| | | |
|---|---|---|
| EP | 2387243 A2 | 11/2011 |
| GB | 2503295 A | 12/2013 |
| GB | 2523347 A | 8/2015 |
| RU | 2009122479 A | 12/2010 |
| WO | 2011128268 A1 | 10/2011 |

OTHER PUBLICATIONS

Patents Act 1977: Examination Report under Section 18(4) issued in Application No. GB1519297.4 dated Sep. 18, 2017.
David Salomon, "A Concise Introduction to Data Compression, Chapter 2: Huffman Coding" Jan. 1, 2008, Springer, XP055247111, ISBN: 978-1-84800-071-1, pp. 61-91, p. 76-p. 83, p. 78.
Written Opinion of the International Preliminary Examining Authority issued in International Application No. PCT/EP2016/025133 dated Oct. 20, 2017.
Notification of Transmittal of the International Preliminary Report on Patentability issued in International Application No. PCT/EP2016/025133 dated Mar. 14, 2018.
Notification of Transmittal of the International Search Report and the Written Opinion of the International Searching Authority, or the Declaration issued in International Application No. PCT/EP2016/025133 dated Jan. 20, 2017.
Chinese Office Action dated Sep. 28, 2017 (with English Summary and pending claims in English) in corresponding Chinese Application No. 201580009597.9, 15 pages.
Russian Office Action and Patent Search Report (with English Translation) dated Apr. 27, 2017 in Russian Application No. 2016133691/08(052271), 15 pages.
Chinese Office Action (with English Summary) dated May 8, 2017 in Chinese Application No. 201580009597.9, 15 pages.
Japanese Office Action (with English Translation) dated Aug. 15, 2017 issued in corresponding Japanese Application No. 2016-549710, 6 pages.
Decision of Grant (with English Translation) dated Aug. 3, 2017 issued in corresponding Russian Application No. 2016133691/08, 12 pages.
P. Monet et al., "Block Adaptive Quantization of Images," IEEE Transactions on Communications, IEEE Service Center, Piscataway, NJ, USA, vol. 41, No. 2, Feb. 1, 1993, pp. 303-306.
International Search Report issued in International Patent Application No. PCT/EP2015/025007 dated Jun. 3, 2015.
Written Opinion of the International Search Authority issued in International Patent Application No. PCT/EP2015/025007 dated Jun. 3, 2015.
Range coding—Wikipedia, the free encyclopedia, https://en.wikipedia.org/wiki/Range_encoding, Aug. 17, 2016.

* cited by examiner

ENCODERS, DECODERS, AND METHODS

CROSS-REFERENCE TO RELATED APPLICATIONS

This application is a National Stage of PCT/EP2016/025133, filed Nov. 1, 2016, which claims priority under 35 U.S.C. § 119 to GB Application No. 1519297.4, filed Nov. 1, 2015, all of which are incorporated herein by reference in their entirety.

TECHNICAL FIELD

The present disclosure relates to encoders for encoding data to generate corresponding encoded data, for example to encoders employing a form of range encoding. Moreover, the present disclosure relates to methods of encoding data to generate corresponding encoded data, for example to methods of encoding data using a form of range encoding. Furthermore, the present disclosure relates to decoders for decoding encoded data to generate corresponding decoded data, for example to decoders employing a form of range decoding. Furthermore, the present disclosure relates to methods of decoding encoded data to generate corresponding decoded data, for example to methods of decoding encoded data using a form of range decoding. Additionally, the present disclosure relates to codecs employing at least one aforementioned encoder and at least one aforementioned decoder. Yet additionally, the present disclosure relates to a computer program product comprising a non-transitory computer-readable storage medium having computer-readable instructions stored thereon, the computer-readable instructions being executable by a computerized device comprising processing hardware to execute at least one of the aforementioned methods. The encoded data includes, for example, sensor data representative of a real physical variable, for example a captured image, seismic data, biometric data, genomic data, X-ray imaging data and so forth.

BACKGROUND

Range coding in reference "Range_encoding"—Wikipedia, the free encyclopedia URL: http://en.wikipedia.org/wiki/Range_encoding (accessed Aug. 19, 2015) is used widely in situations where data compression is required, for example in video coding, image coding, audio coding, and data coding.

In overview, in range coding, probabilities of occurrences of symbols present in a data set that is to be encoded at an encoder have to be known, otherwise a compression efficiency of a range coding method utilized in the encoder suffers greatly. Each symbol present in the data set has an associated probability of occurrence, which defines a corresponding "range" during encoding of the data set; larger the probability of occurrence, larger is the range. When symbols in the data set are encoded in the encoder, the range is updated according to the probability of the encoded symbol. If the range becomes small enough, the encoder employing range encoding emits a byte and increases the range. Thus, with the more common symbols, the range decreases slowly and more symbols can be coded before a byte is emitted. Closer the probability of a symbol being coded is to an actual probability of the symbol at the time of coding, better is the coding efficiency of range coding.

Moreover, contemporary range coding is effective for coding large data sets, where probabilities of different possible symbols present in the large data sets are known. Usually, the probabilities are predetermined or delivered, for example by employing methods as described in a published UK patent document [GB2523348A or GB2523347A, for an entire data set to be coded for generating corresponding encoded data. Such an approach represents an efficient method, if different symbols always occur with similar frequencies within the large data set, and are uniformly distributed in the large data set.

However, in practice, some symbols are more common, for example, at a beginning of a data set to be encoded, and some symbols are more common at an end of the data set. In such cases, a set of fixed predetermined probabilities will not provide an optimal coding efficiency in an encoder. Thus, it is conventionally better to modify probabilities for the symbols present in the data set when encoding the data set to generate corresponding encoded data.

It will be appreciated from publicly-accessible patent and technical literature that there exists a lot of different range coding methods. Some of the known implementations use contextual information to modify the probabilities, whereas some other known implementations modify the predetermined probabilities based upon delivered encoded data. Such methods work well when the probabilities of the symbols are uniformly distributed and different from the predetermined probabilities, but perform worse with predetermined probabilities based upon the delivered encoded data than without it, in cases when the symbols in the data set are not uniformly distributed.

SUMMARY

The present disclosure seeks to provide an improved method of encoding input data (D1) to generate corresponding encoded data (E2), wherein the improved method provides improved coding efficiency.

Moreover, the present disclosure seeks to provide an improved encoder for encoding input data (D1) to generate corresponding encoded data (E2), wherein the improved encoder provides in operation improved coding efficiency.

Moreover, the present disclosure seeks to provide an improved method of decoding encoded data (E2) to generate corresponding decoded data (D3), wherein the improved method provides improved decoding efficiency.

Moreover, the present disclosure seeks to provide an improved decoder for decoding encoded data (E2) to generate corresponding decoded data (D3), wherein the improved decoder provides in operation improved decoding efficiency.

A further aim of the present disclosure is to at least partially overcome at least some of the problems of the prior art, as discussed above.

Furthermore, as an amount of data transferred and stored in the world is increasing rapidly as a function of time, and as contemporary data transmission bandwidth and data storage of data communication networks are limited, the present disclosure seeks to provide for more efficient data compression.

In a first aspect, embodiments of the present disclosure provide an encoder including data processing hardware for encoding input data (D1) to generate corresponding encoded data (E2), characterized in that the encoder is operable to process at least one sequence of elements in the input data (D1), wherein:

(i) the elements have corresponding symbols;
(ii) the at least one sequence of elements is processed from a first element thereof to a last element thereof;

(iii) the encoder is operable to compute probabilities of symbols present in the at least one sequence of elements, wherein the probabilities of the symbols are computed whilst disregarding those elements of the at least one sequence that have already been encoded into the encoded data (E2), and wherein the probabilities of the symbols used by the encoder for generating the encoded data (E2) are adaptively changed as the at least one sequence of elements is progressively encoded into the encoded data (E2); and (iv) the encoder is operable to deliver information describing the probabilities of the symbols.

The present invention is of advantage in that progressively changing computation of the probabilities of the symbols as the at least one sequence of elements is encoded into the encoded data (E2) enables more efficient coding to be achieved.

A manner in which the probabilities are to be computed in the encoder and a corresponding compatible decoder are, for example, known beforehand; in such a case, it is merely necessary to communicate one set of probabilities that are then adaptively changed at the decoder. However, when there are several encoding methods that can be used by the encoder to adaptively change the probabilities, information indicative of an encoding method employed is required to be communicated from the encoder to the corresponding decoder, to describe how the probabilities are to be modified during decoding.

According to an embodiment of the present disclosure, the information describing the probabilities includes the information indicative of the encoding method employed and information indicative of the numbers of occurrences of the symbols in an entirety of the at least one sequence. Thus, the information describing the probabilities describes a manner in which the probabilities are adaptively changed.

According to an embodiment of the present disclosure, the encoder is operable to deliver the information describing the probabilities prior to delivering the encoded data (E2).

Embodiments of the present disclosure are operable to provide improved compression efficiency of range coding compared to conventional methods of range coding data. Methods pursuant to embodiments of the present disclosure adaptively change a probability table that is used when performing range encoding, wherein adaptive changes are based upon frequencies of symbols in a remainder of the at least one sequence to be encoded. Moreover, the methods require that exact, or at least quite accurate, frequencies of symbols are delivered before delivering corresponding range-encoded data. The methods described in the present disclosure are suitable for being used in an encoder, in a decoder, and in a codec including at least one aforesaid encoder and at least one aforesaid decoder. A similar method can also be used, for example, in combination with Arithmetic coding.

Embodiments of the present disclosure enable very efficient range coding when the probabilities of the symbols are known before encoding is executed. There is thereby provided an improvement in encoding efficiency, namely greater data compression in encoded data (E2) in comparison to input data (D1) from which the encoded data (E2) is generated, compared to conventional methods that use fixed probabilities for the symbols even when the symbols are not uniformly distributed.

According to an embodiment of the present disclosure, the input data (D1) includes at least one of: text data, image data, video data, audio data, biometric data, genomic data, medical measurement data, sensor data, data representative of at least one physical variable, seismic data, power consumption measurement data, and/or surveillance data. Optionally, the input data (D1) is also susceptible to include abstract data that is not related to one or more physical variables, for example machine configuration data and similar.

According to an embodiment of the present disclosure, the encoder is operable to compute the probabilities of the symbols each time an element is encoded.

According to another embodiment of the present disclosure, the encoder is operable to compute the probabilities of the symbols after a certain number or a certain percentage of elements are encoded.

According to an embodiment of the present disclosure, the encoder is operable to deliver the probabilities of the symbols in at least one of: a piece-wise manner and/or a delta manner.

Moreover, according to an embodiment of the present disclosure, the encoder is operable to compute the probabilities of the symbols in a weighted manner that is determined based upon characteristics of the symbols of the elements of the at least one sequence.

Furthermore, according to an embodiment of the present disclosure, the encoder is operable to compress the input data (D1) when generating the encoded data (E2), such that the encoded data (E2) has a smaller data size in comparison to the input data (D1).

In a second aspect, embodiments of the present disclosure provide a method of encoding input data (D1) to generate corresponding encoded data (E2), via an encoder including data processing hardware, characterized in that the method includes processing at least one sequence of elements in the input data (D1), wherein the elements have corresponding symbols, and wherein the method includes:

(i) processing the at least one sequence of elements from a first element thereof to a last element thereof;

(ii) computing probabilities of symbols present in the at least one sequence of elements, wherein the probabilities of the symbols are computed whilst disregarding those elements of the at least one sequence that have already been encoded into the encoded data (E2), and wherein the probabilities of the symbols used for generating the encoded data (E2) are adaptively changed as the at least one sequence of elements is progressively encoded into the encoded data (E2); and (iii) delivering information describing the probabilities of the symbols.

The method of encoding the input data (D1) pursuant to the second aspect is capable of improving data compression efficiency of range coding of symbols in cases where the symbols are not uniformly distributed in the input data (D1) to be compressed, namely to be encoded.

In contradistinction to conventional implementations of methods of encoding input data (D1), embodiments of the present disclosure modify the probabilities of the symbols adaptively to achieve an optimal overall compression efficiency, when encoding the symbols to generate corresponding encoded data (E2).

According to an embodiment of the present disclosure, the input data (D1) includes at least one of: text data, image data, video data, audio data, biometric data, genomic data, medical measurement data, sensor data, data representative of at least one physical variable, seismic data, power consumption measurement data, and/or surveillance data. Optionally, the input data (D1) is also susceptible to include abstract data that is not related to one or more physical variables, for example machine configuration data and similar.

According to an embodiment of the present disclosure, the method includes computing the probabilities of the symbols each time an element is encoded.

According to another embodiment of the present disclosure, the method includes computing the probabilities of the symbols after a certain number or a certain percentage of elements are encoded.

According to an embodiment of the present disclosure, the information describing the probabilities includes information indicative of an encoding method employed and information indicative of the numbers of occurrences of the symbols in an entirety of the at least one sequence. Thus, the information describing the probabilities describes a manner in which the probabilities are adaptively changed.

According to an embodiment of the present disclosure, the method includes delivering the information describing the probabilities prior to delivering the encoded data (E2).

According to an embodiment of the present disclosure, the method includes delivering the probabilities of the symbols in at least one of: a piece-wise manner and/or a delta manner.

Moreover, according to an embodiment of the present disclosure, the method includes computing the probabilities of the symbols in a weighted manner that is determined based upon characteristics of the symbols of the elements of the at least one sequence.

Furthermore, according to an embodiment of the present disclosure, the method includes compressing the input data (D1) when generating the encoded data (E2), such that the encoded data (E2) has a smaller data size in comparison to the input data (D1).

In a third aspect, embodiments of the present disclosure provide a decoder including data processing hardware for decoding encoded data (E2) to generate corresponding decoded data (D3), characterized in that the decoder is operable to regenerate at least one sequence of elements encoded into the encoded data (E2), wherein:
(i) the elements have corresponding symbols;
(ii) the at least one sequence of elements is regenerated from a first element thereof to a last element thereof;
(iii) the decoder is operable to receive information describing probabilities of symbols present in the at least one sequence of elements; and
(iv) the decoder is operable to adaptively change the probabilities of the symbols as the at least one sequence of elements is progressively decoded from the encoded data (E2).

According to an embodiment of the present disclosure, the encoded data (E2) includes at least one of: encoded text data, encoded image data, encoded video data, encoded audio data, encoded biometric data, encoded genomic data, encoded medical measurement data, encoded sensor data, encoded data representative of at least one physical variable, encoded seismic data, encoded power consumption measurement data, and/or encoded surveillance data.

According to an embodiment of the present disclosure, the information describing the probabilities includes information indicative of an encoding method employed at a corresponding encoder and information indicative of the numbers of occurrences of the symbols in an entirety of the at least one sequence. Thus, the information describing the probabilities describes a manner in which the probabilities are to be adaptively changed.

According to an embodiment of the present disclosure, the decoder is operable to receive the information describing the probabilities prior to receiving the encoded data (E2).

According to an embodiment of the present disclosure, the decoder is operable to receive the probabilities of the symbols in at least one of: a piece-wise manner and/or a delta manner.

Moreover, according to an embodiment of the present disclosure, the decoder is operable to compute the probabilities of the symbols in a weighted manner that is based upon characteristics of the symbols of the elements of the at least one sequence.

Moreover, according to an embodiment of the present disclosure, the decoder is operable to decompress the encoded data (E2) when generating the decoded data (D3), such that the decoded data (D3) has a larger data size in comparison to the encoded data (E2).

Furthermore, according to an embodiment of the present disclosure, the decoder is operable to apply transcoding to the decoded data (D3).

In a fourth aspect, embodiments of the present disclosure provide a method of decoding encoded data (E2) to generate corresponding decoded data (D3), via a decoder including data processing hardware, characterized in that the method includes regenerating at least one sequence of elements encoded into the encoded data (E2), wherein the elements have corresponding symbols, and wherein the method includes:
(i) regenerating the at least one sequence of elements from a first element thereof to a last element thereof; and
(ii) receiving information describing probabilities of symbols present in the at least one sequence of elements; and
(iii) adaptively changing the probabilities of the symbols as the at least one sequence of elements is progressively decoded from the encoded data (E2).

According to an embodiment of the present disclosure, the encoded data (E2) includes at least one of: encoded text data, encoded image data, encoded video data, encoded audio data, encoded biometric data, encoded genomic data, encoded medical measurement data, encoded sensor data, encoded data representative of at least one physical variable, encoded seismic data, encoded power consumption measurement data, and/or encoded surveillance data.

According to an embodiment of the present disclosure, the information describing the probabilities includes information indicative of an encoding method employed at a corresponding encoder and information indicative of the numbers of occurrences of the symbols in an entirety of the at least one sequence. Thus, the information describing the probabilities describes a manner in which the probabilities are to be adaptively changed.

According to an embodiment of the present disclosure, the method includes receiving the information describing the probabilities prior to receiving the encoded data (E2).

According to an embodiment of the present disclosure, the method includes receiving the probabilities of the symbols in at least one of: a piece-wise manner and/or a delta manner.

Moreover, according to an embodiment of the present disclosure, the method includes computing the probabilities of the symbols in a weighted manner that is based upon characteristics of the symbols of the elements of the at least one sequence.

Moreover, according to an embodiment of the present disclosure, the method includes decompressing the encoded data (E2) when generating the decoded data (D3), such that the decoded data (D3) has a larger data size in comparison to the encoded data (E2).

Furthermore, according to an embodiment of the present disclosure, the method includes applying transcoding to the decoded data (D3).

In a fifth aspect, embodiments of the present disclosure provide a computer program product comprising a non-transitory computer-readable storage medium having computer-readable instructions stored thereon, the computer-readable instructions being executable by a computerized device comprising processing hardware to execute a method pursuant to the aforementioned second aspect.

In a sixth aspect, embodiments of the present disclosure provide a computer program product comprising a non-transitory computer-readable storage medium having computer-readable instructions stored thereon, the computer-readable instructions being executable by a computerized device comprising processing hardware to execute a method pursuant to the aforementioned fourth aspect.

In a seventh aspect, embodiments of the present disclosure provide a codec including at least one encoder for encoding input data (D1) to generate corresponding encoded data (E2) pursuant to the aforementioned first aspect, and at least one decoder for decoding the encoded data (E2) to generate corresponding decoded data (D3) pursuant to the aforementioned third aspect.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and apparatus disclosed herein. Moreover, those in the art will understand that the drawings are not to scale. Wherever possible, like elements have been indicated by identical numbers.

Embodiments of the present disclosure will now be described, by way of example only, with reference to the following diagrams wherein.

Figure 1:
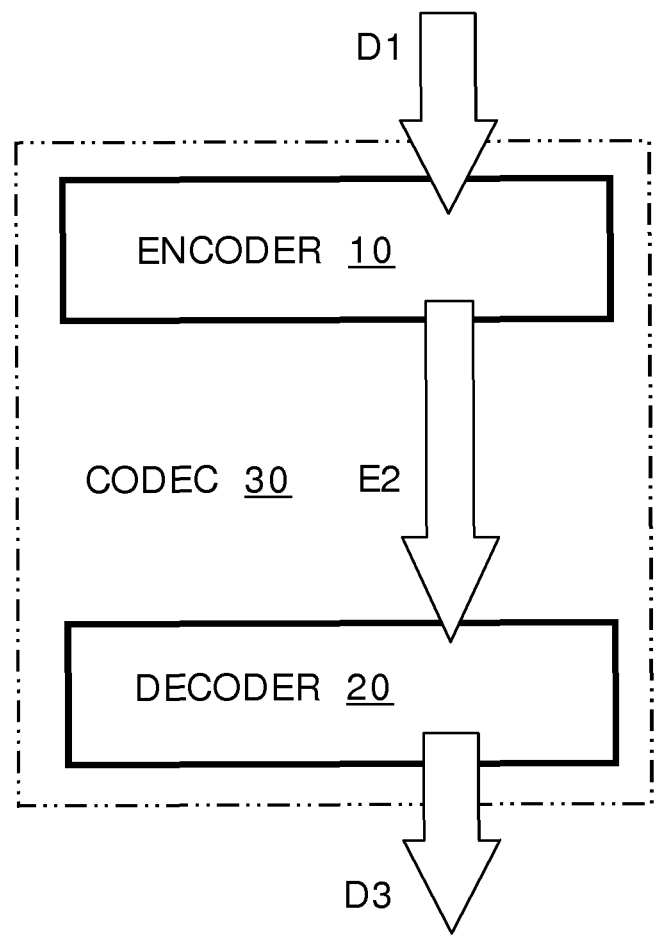
FIG. 1 is a schematic illustration of an encoder for encoding input data (D1) to generate corresponding encoded data (E2) and a decoder for decoding the encoded data (E2) to generate corresponding decoded data (D3), wherein the encoder and the decoder collectively form a codec, in accordance with an embodiment of the present disclosure.

In the accompanying diagrams, an underlined number is employed to represent an item over which the underlined number is positioned or an item to which the underlined number is adjacent.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practising the present disclosure are also possible.

In a first aspect, embodiments of the present disclosure provide an encoder including data processing hardware for encoding input data (D1) to generate corresponding encoded data (E2), characterized in that the encoder is operable to process at least one sequence of elements in the input data (D1), wherein:
(i) the elements have corresponding symbols;
(ii) the at least one sequence of elements is processed from a first element thereof to a last element thereof;
(iii) the encoder is operable to compute probabilities of symbols present in the at least one sequence of elements, wherein the probabilities of the symbols are computed whilst disregarding those elements of the at least one sequence that have already been encoded into the encoded data (E2), and wherein the probabilities of the symbols used by the encoder for generating the encoded data (E2) are adaptively changed as the at least one sequence of elements is progressively encoded into the encoded data (E2); and
(iv) the encoder is operable to deliver information describing the probabilities of the symbols.

The input data (D1) can be any type of data that can be represented with symbols. Examples of symbols include, but are not limited to, alphabetical characters, alphanumeric characters, numeric characters, and sequences thereof. Moreover, the input data (D1) can be original data, source data, data processed with some other encoding method, or a stream of data.

According to an embodiment of the present disclosure, the input data (D1) includes at least one of: text data, image data, video data, audio data, biometric data, genomic data, medical measurement data, sensor data, data representative of at least one physical variable, seismic data, power consumption measurement data, and/or surveillance data. Optionally, the input data (D1) is captured by using one or more sensors, for example a pixel image sensor, a sensor that is operable to sense one or more physical variables, a microphone, and similar. Optionally, the input data (D1) is also susceptible to include abstract data that is not related to one or more physical variables, for example machine configuration data and similar.

Moreover, the encoder is susceptible to being implemented using dedicated digital hardware, for example a field-programmable gate array (FPGA), and/or by using a data processor that is operable to execute program instructions. Optionally, the data processor is included in a portable wireless communication device, and the program instructions are provided to the device via one or more downloadable software applications, conventionally known as "Apps". Examples of the portable wireless communication device include, but are not limited to, a smart phone, a Mobile Internet Device (MID), a phablet computer, a tablet computer, an Ultra-Mobile Personal Computer (UMPC), a Personal Digital Assistant (PDA), a web pad, a handheld Personal Computer (PC) and a laptop computer.

Optionally, the encoded data (E2) is communicated from the encoder to a corresponding decoder by using one or more data files, or by streaming data from the encoder to the decoder. The encoded data (E2) is susceptible to being communicated via a data carrier, for example, such as an optical disc data memory and/or a solid state data memory, or communicated via a data communication network, for example via the Internet or a telephony network.

According to an embodiment of the present disclosure, the encoder is operable to compute the probabilities of the symbols each time an element is encoded. In such a case, the probabilities of the symbols are adaptively changed in a substantially continuous manner along the at least one sequence.

When there is only a small amount of data that is being encoded and delivered, it is beneficial to adapt the probabilities of the symbols frequently, as even small changes in numbers of occurrences of the symbols are significant. On the other hand, when there is a large amount of data that is being encoded and delivered, it may not be beneficial to adapt the probabilities of the symbols each time an element is encoded.

According to another embodiment of the present disclosure, the encoder is operable to compute the probabilities of the symbols after a certain number or a certain percentage of elements are encoded. The certain number or the certain percentage is not required to be a constant. Optionally, the certain number or the certain percentage is determined based upon the number of elements that are yet not encoded into the encoded data (E2), namely the number of remaining elements in the at least one sequence.

Optionally, in this regard, the encoder is operable to use polynomials to determine how often the probabilities of the symbols are required to be computed.

An advantage of such probability computation is that a number of probability computations that are required to be performed in operation in the encoder and the decoder is significantly decreased. Another advantage of such probability computation is that towards an end of the at least one sequence, namely approaching the last element thereof, the probabilities of those symbols that are not present in a remainder of the at least one sequence are zero or close to zero, while the probabilities of those symbols that are still present in the remainder of the at least one sequence are comparatively large. Moreover, in a case where last few elements of the at least one sequence have a same symbol, a requirement to send data in relation thereto is greatly reduced, as the probability of that symbol is already one or very close to one.

It will be appreciated that when a given element of the at least one sequence is encoded into the encoded data (E2), the encoder is optionally operable to adaptively change the probabilities by:
(a) adaptively decreasing the probability of a symbol that corresponds to the given element, and
(b) adaptively increasing the probabilities of other non-zero probability symbols of the at least one sequence that are yet to be encoded.

It should be appreciated that after this change, the probabilities describe probabilities of symbols for the remaining elements, as such or as weighted.

In this manner, the probabilities are changed adaptively to describe what is remaining in the at least one sequence to be encoded.

Optionally, in this regard, the probabilities are adaptively changed in a following manner:
(i) the encoder performs an initial analysis of the at least one sequence to determine the numbers of occurrences of the symbols in the at least one sequence,
(ii) the encoder then computes the probabilities of the symbols in an entirety of the at least one sequence, and delivers the probabilities of the symbols and the total number of elements in the at least one sequence to the decoder,
(iii) each time a given element is encoded, the encoder decreases the number of occurrences of a symbol corresponding to the given element, and adaptively computes the probabilities of the symbols.

Examples of how the probabilities of the symbols can be adaptively changed have been provided later.

As the encoder has knowledge of the probabilities of the symbols in the entirety of the at least one sequence, the encoder is operable to adapt the probabilities corresponding to remaining elements of the at least one sequence, namely elements that are yet to be encoded. Thus, the encoder pursuant to embodiments of the present disclosure operates unlike conventional encoders, which do not have knowledge of the probabilities, but make an assumption that symbols that have been delivered previously will be delivered often in the future as well, and thus, adaptively increase the probability of a symbol as elements having that symbol are being encoded.

Moreover, it is to be noted here that instead of the probabilities of the symbols, the encoder can use the numbers of occurrences or ranges of the symbols for delivery to the corresponding decoder. Hereinabove, the term "numbers of occurrences" refers to frequencies of occurrences of symbols in the at least one sequence. Optionally, in this regard, the probabilities of the symbols are then determined based upon the numbers of occurrences of the symbols.

A manner in which the probabilities are to be computed in the encoder and the corresponding decoder are, for example, known beforehand; in such a case, it is merely necessary to communicate one set of probabilities that are then adaptively changed at the decoder. However, when there are several encoding methods that can be used by the encoder to adaptively change the probabilities, information indicative of an encoding method employed is required to be communicated from the encoder to the corresponding decoder, to describe how the probabilities are to be modified during decoding.

According to an embodiment of the present disclosure, the information describing the probabilities includes the information indicative of the encoding method employed and information indicative of the numbers of occurrences of the symbols in the entirety of the at least one sequence. Thus, the information describing the probabilities describes a manner in which the probabilities are adaptively changed.

According to an embodiment of the present disclosure, the encoder is operable to deliver the information describing the probabilities prior to delivering the encoded data (E2).

According to an embodiment of the present disclosure, the encoder is operable to deliver the probabilities of the symbols in at least one of: a piece-wise manner and/or a delta manner.

It will be appreciated that the probabilities of the symbols can be delivered in other alternative manners, without departing from the scope of the present disclosure. As an example, the probabilities of the symbols can be delivered by employing methods as described in a published UK patent document GB2523348A.

Optionally, when the probabilities are delivered in a delta manner, the probabilities are indicated by way of decremental and/or incremental parameters.

Optionally, when the probabilities are delivered in a piece-wise manner, the probabilities are delivered sequentially piece-by-piece. In other words, the probabilities are delivered in respect of their respective pieces, wherein the probabilities are delivered in a sequential manner in the encoded data (E2).

For illustration purposes only, there will now be considered an example of how the probabilities can be delivered to the decoder in a linear piece-wise manner. There will now be considered that a data sequence to be encoded has 40 different symbols, and the probabilities used to encode the symbols are as follows:
(i) the first ten symbols have a probability of 0.04 each,
(ii) the next 20 symbols have a probability that linearly descends from 0.03 to 0.01, and
(iii) the last ten symbols have a probability of 0.02 each.

These probabilities can be delivered to the decoder by sending to the decoder the following information:
the total number of symbols (=40), the number of piece-wise sets (=3), lengths of these piece-wise sets (=10, 20 and 10), features of the piece-wise sets (for example, '0' or '1' to indicate constant or linear probabilities, one probability value for the constant probabilities, and two probability values for indicating start and finish points of the linear probabilities).

Following values can be used to represent the probabilities of all 40 symbols to the decoder:
40, 3, 10, 20, 10, 0, 0.04, 1, 0.03, 0.01, 0, 0.02

Thus, there are only 12 values that are required to be delivered, instead of all 40 probabilities.

It is potentially beneficial to decrement a count of the values that are required to be delivered by deleting redundant values. In the above example, the count of the values can be decremented form 12 to 11 by deleting any one of: the second value (3), the fifth value (10) or the first value (40). In other words, each of these values can be computed, as long as four other values out of the first five values are delivered. As it is most beneficial to delete the largest value to reduce the size of data to be delivered, the first value (40) is optionally deleted. It will be appreciated that the value (40) can be computed as a sum of three values (10, 20 and 10).

Moreover, optionally, the probabilities are delivered by way of a frequency table and/or a probability table, for example, as will be illustrated with examples later.

Moreover, according to an embodiment of the present disclosure, the encoder is operable to compute the probabilities of the symbols in a weighted manner that is determined based upon characteristics of the symbols of the elements of the at least one sequence.

Optionally, in this regard, the encoder is operable to assign weights to the elements of the at least one sequence using different weighting regimes. Optionally, the elements are assigned the weights based upon their location within the at least one sequence. As an example, elements occurring at a beginning of the at least one data sequence are assigned higher weights compared to elements occurring at the end of the at least one sequence.

Optionally, the encoder is operable to switch between the different weighting regimes based upon the characteristics of the symbols of the elements of the at least one sequence.

Optionally, the characteristics of the symbols correspond to one or more types of data present in the at least one sequence. As an example, the input data (D1) can be a mixture of audio data, video data, image data and genomic data, which are arranged as blocks of different types of data. In such a case, different weighting regimes can be used for the different types of data, namely the audio data, the video data, the image data and the genomic data.

Optionally, information indicative of the weights of the elements is also included in the information describing the probabilities. Optionally, in this regard, the information indicative of the weights of the elements defines one or more weighting regimes that are used and a manner in which the weights decrease, starting from the first element to the last element.

It will be appreciated that computing the probabilities of the symbols in a weighted manner potentially enables the encoder to compute more accurate probabilities not only for those symbols that occur at the end of the at least one sequence, but also for those symbols that occur at the beginning of the at least one sequence, as will be illustrated with examples later.

As the information indicative of the weights of the elements increases an overhead of data included in the encoded data (E2), it is advantageous to select an optimal weighting regime for different types of data. Optionally, a weighting regime to be used for a given type of data is predetermined. Additionally or alternatively, optionally, a weighting regime to be used is selected from amongst a plurality of weighting regimes, and information indicative of the selected weighting regime is then delivered together with the frequency table and/or the probability table. Such an approach is very efficient at reducing the overhead of data in the encoded data (E2), but may impose a degree of inflexibility in an operation of the encoder, as only a limited number of weighting regimes is accommodated.

Pursuant to embodiments of the present disclosure, the encoder is operable to adaptively change the probabilities of the symbols, when the probabilities of the symbols present in the entirety of the at least one sequence are known beforehand, namely before the at least one sequence is encoded. In other words, in a case where the at least one sequence is known beforehand, the probabilities of the symbols are adaptively changed after a given element is encoded, as it is known that there is one less of its associated symbol to be encoded in a remainder of the at least one sequence to be encoded into the encoded data (E2). In particular, the probabilities of the symbols are adaptively changed as the at least one sequence of elements is progressively encoded into the encoded data (E2) in a manner that a probability of a given symbol is decreased when an element having the given symbol is encoded into the encoded data (E2). As a consequence, the probabilities of the symbols are substantially similar to exact probabilities of the symbols in the remainder of the at least one sequence.

Moreover, the encoder is operable to adaptively change a frequency table and/or a probability table that is used when performing range encoding, wherein adaptive changes are based upon frequencies of symbols in a remainder of the at least one sequence to be encoded. This requires that exact, or at least quite accurate, frequencies of symbols are delivered before delivering corresponding range-encoded data (E2). The accuracy of the frequencies of the symbols delivered before delivering the corresponding range-encoded data (E2) needs to be so accurate that the modified probabilities are valid for the remainder of the at least one sequence that has not yet been encoded. As an example, the modified probability of a given symbol cannot be zero, when the given symbol is encoded. Within the limits of precision, as the amount of data to be encoded decreases, the probability of the symbols can be set to a minimum range or to zero based upon whether more elements can still arrive.

Moreover, according to an embodiment of the present disclosure, when the probabilities of the symbols are not known exactly, for example, as in a case when the input data (D1) is being captured and encoded for streaming in real time, the encoder is operable to assign a same probability to all the symbols present in the at least one sequence initially. In this embodiment, the probabilities of the symbols are adaptively changed as the at least one sequence of elements is progressively encoded into the encoded data (E2) in a manner that a probability of a given symbol is decreased after an element having the given symbol is encoded into the encoded data (E2).

The adaptive computation of probabilities are implemented in a mutually similar manner in the encoder and the decoder, in order to ensure that the probabilities match when a given element is encoded at the encoder and when a corresponding encoded element is decoded at the decoder.

Furthermore, according to an embodiment of the present disclosure, the encoder is operable to compress the input data (D1) when generating the encoded data (E2), such that the encoded data (E2) has a smaller data size in comparison to the input data (D1).

In a second aspect, embodiments of the present disclosure provide a method of encoding input data (D1) to generate corresponding encoded data (E2), via an encoder including data processing hardware, characterized in that the method includes processing at least one sequence of elements in the input data (D1), wherein the elements have corresponding symbols, and wherein the method includes:

(i) processing the at least one sequence of elements from a first element thereof to a last element thereof;
(ii) computing probabilities of symbols present in the at least one sequence of elements, wherein the probabilities of the symbols are computed whilst disregarding those elements of the at least one sequence that have already been encoded into the encoded data (E2), and wherein the probabilities of the symbols used for generating the encoded data (E2) are adaptively changed as the at least one sequence of elements is progressively encoded into the encoded data (E2); and
(iii) delivering information describing the probabilities of the symbols.

Optionally, when a given element of the at least one sequence is encoded into the encoded data (E2), the method includes adaptively changing the probabilities by:
(a) adaptively decreasing the probability of a symbol that corresponds to the given element, and
(b) adaptively increasing the probabilities of other symbols corresponding to remaining elements of the at least one sequence that are yet to be encoded.

The input data (D1) can be any type of data that can be represented with symbols. Examples of symbols include, but are not limited to, alphabetical characters, alphanumeric characters, numeric characters, and sequences thereof. Moreover, the input data (D1) can be original data, source data, data processed with some other encoding method, or a stream of data.

According to an embodiment of the present disclosure, the input data (D1) includes at least one of: text data, image data, video data, audio data, biometric data, genomic data, medical measurement data, sensor data, data representative of at least one physical variable, seismic data, power consumption measurement data, and/or surveillance data. Optionally, the input data (D1) is captured by using one or more sensors, for example a pixel image sensor, a sensor that is operable to sense one or more physical variables, a microphone, and similar. Optionally, the input data (D1) is also susceptible to include abstract data that is not related to one or more physical variables, for example machine configuration data and similar.

The method can also be used, for example, in combination with Arithmetic coding.

Optionally, the encoded data (E2) is communicated from the encoder to a corresponding decoder by using one or more data files, or by streaming data from the encoder to the decoder. The encoded data (E2) is susceptible to being communicated via a data carrier, for example, such as an optical disc data memory and/or a solid state data memory, or communicated via a data communication network, for example via the Internet or a telephony network.

According to an embodiment of the present disclosure, the method includes computing the probabilities of the symbols each time an element is encoded. In such a case, the probabilities of the symbols are adaptively changed in a substantially continuous manner along the at least one sequence.

According to another embodiment of the present disclosure, the method includes computing the probabilities of the symbols after a certain number or a certain percentage of elements are encoded. An advantage of such probability computation is that a number of probability computations that are required to be performed in operation in the method is significantly decreased. Another advantage of such probability computation is that towards an end of the at least one sequence, namely approaching the last element thereof, the probabilities of those symbols that are not present in a remainder of the at least one sequence are zero or close to zero, while the probabilities of those symbols that are still present in the remainder of the at least one sequence are comparatively large. Moreover, in a case where last few elements of the at least one sequence have a same symbol, a requirement to send data in relation thereto is greatly reduced, as the probability of that symbol is already one, or very close to one.

Moreover, it is to be noted here that instead of the probabilities of the symbols, the numbers of occurrences or ranges of the symbols can also be used.

According to an embodiment of the present disclosure, the information describing the probabilities includes information indicative of an encoding method employed and information indicative of the numbers of occurrences of the symbols in an entirety of the at least one sequence. Thus, the information describing the probabilities describes a manner in which the probabilities are adaptively changed.

According to an embodiment of the present disclosure, the method includes delivering the information describing the probabilities prior to delivering the encoded data (E2).

According to an embodiment of the present disclosure, the method includes delivering the probabilities of the symbols in at least one of: a piece-wise manner and/or a delta manner.

Optionally, when the probabilities are delivered in a delta manner, the probabilities are indicated by way of decremental and/or incremental parameters.

Optionally, when the probabilities are delivered in a piece-wise manner, the probabilities are delivered sequentially piece-by-piece.

Optionally, the probabilities are delivered by way of a frequency table and/or a probability table, for example, as will be illustrated with examples later.

Moreover, according to an embodiment of the present disclosure, the method includes computing the probabilities of the symbols in a weighted manner that is determined based upon characteristics of the symbols of the elements of the at least one sequence.

Optionally, in this regard, the method includes assigning weights to the elements of the at least one sequence using different weighting regimes. Optionally, in the method, the elements are assigned the weights based upon their location within the at least one sequence. As an example, elements occurring at a beginning of the at least one data sequence are assigned higher weights compared to elements occurring at the end of the at least one sequence.

Optionally, the method includes switching between the different weighting regimes based upon the characteristics of the symbols of the elements of the at least one sequence.

Optionally, the characteristics of the symbols correspond to one or more types of data present in the at least one sequence. As an example, the input data (D1) can be a mixture of audio data, video data, image data and genomic data, which are arranged as blocks of different types of data. In such a case, different weighting regimes can be used for the different types of data, namely the audio data, the video data, the image data and the genomic data.

Optionally, information indicative of the weights of the elements is also included in the information describing the probabilities.

It will be appreciated that computing the probabilities of the symbols in a weighted manner potentially enables the aforementioned method to compute more accurate probabilities not only for those symbols that occur at the end of the at least one sequence, but also for those symbols that occur at the beginning of the at least one sequence, as will be illustrated with examples later.

As the information indicative of the weights of the elements increases an overhead of data included in the encoded data (E2), it is advantageous to select an optimal weighting regime for different types of data. Optionally, a weighting regime to be used for a given type of data is predetermined. Additionally or alternatively, optionally, a weighting regime to be used is selected from amongst a plurality of weighting regimes, and a decision of the selected weighting regime is then delivered together with the frequency table and/or the probability table. Such an approach is very efficient at reducing the overhead of data in the encoded data (E2), but may impose a degree of inflexibility in an operation of the aforementioned method, as only a limited number of weighting regimes is accommodated.

Pursuant to embodiments of the present disclosure, in the method, the probabilities of the symbols are adaptively changed when the probabilities of the symbols present in the entirety of the at least one sequence are known beforehand, namely before the at least one sequence is encoded. In other words, in a case where the at least one sequence is known beforehand, the probabilities of the symbols are adaptively changed after a given element is encoded, as it is known that there is one less of its associated symbol to be encoded in a remainder of the at least one sequence to be encoded into the encoded data (E2). In particular, the probabilities of the symbols are adaptively changed as the at least one sequence of elements is progressively encoded into the encoded data (E2) in a manner that a probability of a given symbol is decreased when an element having the given symbol is encoded into the encoded data (E2). As a consequence, the probabilities of the symbols are substantially similar to exact probabilities of the symbols in the remainder of the at least one sequence.

Moreover, according to an embodiment of the present disclosure, when the probabilities of the symbols are not known exactly, for example, as in a case when the input data (D1) is being captured and encoded for streaming in real time, the method includes assigning a same probability to all the symbols present in the at least one sequence initially. In this embodiment, the probabilities of the symbols are adaptively changed as the at least one sequence of elements is progressively encoded into the encoded data (E2) in a manner that a probability of a given symbol is decreased after an element having the given symbol is encoded into the encoded data (E2).

The adaptive computation of probabilities are implemented in a mutually similar manner in the encoder and the decoder, in order to ensure that the probabilities match when a given element is encoded at the encoder and when a corresponding encoded element is decoded at the decoder.

Furthermore, according to an embodiment of the present disclosure, the method includes compressing the input data (D1) when generating the encoded data (E2), such that the encoded data (E2) has a smaller data size in comparison to the input data (D1).

For illustration purposes only, there will next be described an example of how the aforementioned method can be used for encoding a sequence of elements in given input data (D1). The sequence of elements in the input data (D1) is hereinafter referred to as a "data sequence", for the sake of convenience.

The data sequence includes a series of elements 'S(1)' to 'S(n)', wherein 'n' is a total number of elements in the data sequence. An element 'SW' is at a beginning of the data sequence, and an element 'S(n)' is at an end of the data sequence. There are 'm' different symbols present in the data sequence, and each symbol has a probability of occurrence in the data sequence.

In the example, there will be now considered that the data sequence includes 20 elements (namely, n=20) that have five different symbols (namely, m=5), as follows:

[0, 1, 0, 2, 0, 0, 2, 2, 4, 2, 2, 2, 2, 2, 3, 2, 2, 3, 4, 4],

In other words,

S(1)=0,
S(2)=1,
S(3)=0,
S(4)=2,
S(5)=0,
S(6)=0,
S(7)=2,
S(8)=2,
S(9)=4,
S(10)=2,
S(11)=2,
S(12)=2,
S(13)=2,
S(14)=2,
S(15)=3,
S(16)=2,
S(17)=2,
S(18)=3,
S(19)=4,
S(20)=4, and the five different symbols are: 0, 1, 2, 3 and 4.

In a (table) 'T1' below, there are presented frequencies, probabilities and ranges of occurrences of the five different symbols in the data sequence. In this regard, a probability of occurrence of a given symbol is computed by dividing a frequency of occurrence of the given symbol by a total number of elements in the data sequence. Throughout the present disclosure, the phrases "a probability of occurrence of a symbol" and "a probability of a symbol" have been used interchangeably.

The full range for all the symbols is assumed to be 128. Accordingly, a range of a given symbol is computed by multiplying the full range with a probability of the given symbol. It is to be noted here that the ranges have been rounded off using regular rounding rules. In a case when the sum of the ranges does not fit evenly into a power of two, the largest range values are optionally increased so as to achieve a desired power of two. Moreover, as no range value can be rounded off to zero, a large enough multiplication coefficient is optionally selected as the full range. Alternatively, optionally, the smallest range values are increased and set to one, irrespective of values of corresponding probabilities.

T1

Frequencies and Probabilities of Symbols Before Encoding

| Symbol | Frequency | Probability | Range |
|---|---|---|---|
| 0 | 4 | 0.2 | 26 |
| 1 | 1 | 0.05 | 6 |
| 2 | 10 | 0.5 | 64 |
| 3 | 2 | 0.10 | 13 |
| 4 | 3 | 0.15 | 19 |

It will be appreciated that the probabilities of the symbols presented in the table 'T1' are the probabilities of the symbols in an entirety of the data sequence, which are delivered from an encoder to a corresponding decoder prior to encoding. This enables the decoder to begin a decoding process.

As an example, the probabilities of the symbols can be expressed by any one of:
(i) delivering values 4, 1, 10, 2, 3, namely the frequencies of occurrences of the symbols,
(ii) delivering the values 0.2, 0.05, 0.5, 0.10, 0.15, namely the probabilities of the symbols, or
(iii) delivering the values 26, 6, 64, 13, 19, namely the ranges of the symbols.

Now, the probabilities of the symbols are adaptively changed as the data sequence is progressively encoded, namely as the elements of the data sequence are encoded one after another from the first element 'S(1)' to the last element 'S(20)', whilst disregarding those elements of the data sequence that have already been encoded into the encoded data (E2). This method could be referred to, for example, as 'RangeAdapt'. Accordingly, the information indicative of the encoding method optionally includes a parameter 'RangeAdapt' to define the encoding method.

Thus, each time an element is encoded, the probabilities of the symbols are recomputed by dividing their respective frequencies of occurrences in a remainder of the data sequence that is not yet encoded by a number of elements in the remainder of the data sequence.

As an example, after the first element 'SW' is encoded, the probabilities of the symbols are recomputed as follows:
the probability of the symbol '0'=3/19=0.15789,
the probability of the symbol '1'=1/19=0.05263,
the probability of the symbol '2'=10/19=0.52632,
the probability of the symbol '3'=2/19=0.10526, and
the probability of the symbol '4'=3/19=0.15789.

In a (table) 'T2' below, there are presented the probabilities of the symbols that are computed as the data sequence is encoded element-by-element. It will be appreciated that after the last element 'S(20)' is encoded, an entire data sequence is encoded into the encoded data (E2); therefore, the probabilities of the symbols are recomputed till a last-but-one element 'S(19)' is encoded.

| T2: Probabilities of Symbols after Encoding of each Element | | | | | | |
|---|---|---|---|---|---|---|
| Number of Element Encoded | Symbol associated with Element Encoded | Probability of Symbol '0' | Probability of Symbol '1' | Probability of Symbol '2' | Probability of Symbol '3' | Probability of Symbol '4' |
| 0 |  | 0.2 | 0.05 | 0.5 | 0.1 | 0.15 |
| 1 | 0 | 0.15789 | 0.05263 | 0.52632 | 0.10526 | 0.15789 |
| 2 | 1 | 0.16667 | 0 | 0.55556 | 0.11111 | 0.16667 |
| 3 | 0 | 0.11765 | 0 | 0.58824 | 0.11765 | 0.17647 |
| 4 | 2 | 0.125 | 0 | 0.5625 | 0.125 | 0.1875 |
| 5 | 0 | 0.06667 | 0 | 0.6 | 0.13333 | 0.2 |
| 6 | 0 | 0 | 0 | 0.64286 | 0.14286 | 0.21429 |
| 7 | 2 | 0 | 0 | 0.61538 | 0.15385 | 0.23077 |
| 8 | 2 | 0 | 0 | 0.58333 | 0.16667 | 0.25 |
| 9 | 4 | 0 | 0 | 0.63636 | 0.18182 | 0.18182 |
| 10 | 2 | 0 | 0 | 0.6 | 0.2 | 0.2 |
| 11 | 2 | 0 | 0 | 0.55556 | 0.22222 | 0.22222 |
| 12 | 2 | 0 | 0 | 0.5 | 0.25 | 0.25 |
| 13 | 2 | 0 | 0 | 0.42857 | 0.28571 | 0.28571 |
| 14 | 2 | 0 | 0 | 0.33333 | 0.33333 | 0.33333 |
| 15 | 3 | 0 | 0 | 0.4 | 0.2 | 0.4 |
| 16 | 2 | 0 | 0 | 0.25 | 0.25 | 0.5 |
| 17 | 2 | 0 | 0 | 0 | 0.33333 | 0.66667 |
| 18 | 3 | 0 | 0 | 0 | 0 | 1 |
| 19 | 4 | 0 | 0 | 0 | 0 | 1 |
| 20 | 4 | 0 | 0 | 0 | 0 | 0 |

It will be appreciated in respect of the (table) 'T2' that after encoding six elements of the data sequence, the probabilities of the symbols '0' and '1' in a remainder of the data sequence are already zero, and that the probabilities of all the symbols differ from the probabilities computed for the entire data sequence, namely the probabilities shown in the (table) 'T1'. Moreover, in the illustrated example, after encoding 18 elements of the data sequence, the probability of the symbol '4' is one. This implies that the elements 'S(19)' and 'S(20)' have the symbol '4'.

In the illustrated example, exact values of the probabilities of the symbols are known beforehand, and are transmitted to a given decoder initially. The probabilities of the symbols can be transmitted by way of the frequencies of occurrences of the symbols, the probabilities of the symbols, or the ranges of the symbols. Even if an approximation of the probabilities of the symbols is transmitted to the given decoder, it is not necessary to send the last two elements having the symbol '4' as the probability of the symbol '4' is one at the end of the data sequence.

The aforementioned method of encoding the data sequence, as described above, progressively improves a compression ratio of data achieved in the encoded data (E2) by using more accurate probabilities of those symbols that occur at the end of the data sequence.

When probabilities of symbols that occur at the beginning of the data sequence are also required to be accurate, then it is advantageous to use, for example, weighting of the symbols. There are various different methods available for weighting the symbols.

For illustration purposes only, there will next be described a simple example of how the probabilities of the symbols can be computed in a weighted manner. In this example, integer weights are used to improve all the probabilities used during encoding of the data sequence for inclusion into the encoded data (E2). This method could be referred to, for example, as 'RangeLWAdapt', wherein 'LW' refers to Linear Weighted. Accordingly, the information indicative of the encoding method optionally includes a parameter 'RangeLWAdapt' to define the encoding method.

Each element present in the data sequence of the input data (D1) is assigned an index, for example, corresponding to its position in the data sequence. Considering the data sequence from the previous example, the elements from the first element 'S(1)' to the last element 'S(20)' are assigned indices from '0' to '19', respectively.

Next, a weight of a given symbol is calculated using the following equation (Eq. 1):

$$W = N - I \qquad \text{Eq. 1}$$

In the above equation (Eq. 1), 'W' represents the weight of the given symbol, 'N' represents the total number of elements in the data sequence, and 'I' represents an index of the given symbol.

Thus, the weight of the first symbol 'S(1)' is 20, the weight of the second symbol 'S(2)' is 19, and so forth, and the weight of the last symbol 'S(20)' is 1.

Now, a total sum of weights of the elements in the data sequence is calculated as follows:

20+19+18+17+16+15+14+13+12+11+10+9+8+7+6+5+4+3+2+1=210.

In a (table) 'T3' below, there are presented the frequencies and probabilities of the symbols with their associated weights for the entire data sequence. In this regard, a probability of a given symbol is computed by dividing a weighted frequency of the given symbol by the total sum of the weights of the elements in the data sequence.

T3

Frequencies and Probabilities of
Symbols with Weighting Before Encoding

| Symbol | Frequency | Probability |
|---|---|---|
| 0 | 69 | 0.32857 |
| 1 | 19 | 0.09048 |
| 2 | 98 | 0.46667 |
| 3 | 9 | 0.04286 |
| 4 | 15 | 0.07143 |

Now, the probabilities of the symbols are adaptively changed as the data sequence is progressively encoded into the encoded data (E2), whilst disregarding those elements of the data sequence that have already been encoded into the encoded data (E2).

Thus, each time an element is encoded, the probabilities of the symbols are recomputed by dividing their respective weighted frequencies in a remainder of the data sequence that is not yet encoded by a sum of weights of elements in the remainder of the data sequence. In other words, when a given element is encoded into the encoded data (E2), the weighted frequency of its associated symbol is decreased by a weight of the given element, and the total sum of the weights of the elements is also decreased by the weight of the given element.

As an example, after the first element 'SW' is encoded, the probabilities of the symbols are recomputed as follows:

the probability of the symbol '0'=49/190=0.25789, the probability of the symbol '1'=19/190=0.1, the probability of the symbol '2'=98/190=0.51579, the probability of the symbol '3'=9/190=0.04737, and the probability of the symbol '4'=15/190=0.07895.

In a (table) 'T4' below, there are presented the probabilities of the symbols with weighting that are computed as the data sequence is encoded element-by-element.

T4: Probabilities of Symbols with Weighting after Encoding of each Element

| Number of Element Encoded | Symbol associated with Element Encoded | Probability of Symbol '0' | Probability of Symbol '1' | Probability of Symbol '2' | Probability of Symbol '3' | Probability of Symbol '4' |
|---|---|---|---|---|---|---|
| 0 |   | 0.32857 | 0.09048 | 0.46667 | 0.04286 | 0.07143 |
| 1 | 0 | 0.25789 | 0.1 | 0.51579 | 0.04737 | 0.07895 |
| 2 | 1 | 0.28655 | 0 | 0.57310 | 0.05263 | 0.08772 |
| 3 | 0 | 0.20261 | 0 | 0.64052 | 0.05882 | 0.09804 |
| 4 | 2 | 0.22794 | 0 | 0.59559 | 0.06618 | 0.11029 |
| 5 | 0 | 0.125 | 0 | 0.675 | 0.075 | 0.125 |

-continued

T4: Probabilities of Symbols with Weighting after Encoding of each Element

| Number of Element Encoded | Symbol associated with Element Encoded | Probability of Symbol '0' | Probability of Symbol '1' | Probability of Symbol '2' | Probability of Symbol '3' | Probability of Symbol '4' |
|---|---|---|---|---|---|---|
| 6  | 0 | 0 | 0 | 0.77143 | 0.08571 | 0.14286 |
| 7  | 2 | 0 | 0 | 0.73626 | 0.09890 | 0.16484 |
| 8  | 2 | 0 | 0 | 0.69231 | 0.11538 | 0.19231 |
| 9  | 4 | 0 | 0 | 0.81818 | 0.13636 | 0.04545 |
| 10 | 2 | 0 | 0 | 0.78182 | 0.16364 | 0.05455 |
| 11 | 2 | 0 | 0 | 0.73333 | 0.2 | 0.06667 |
| 12 | 2 | 0 | 0 | 0.66667 | 0.25 | 0.08333 |
| 13 | 2 | 0 | 0 | 0.57143 | 0.32143 | 0.10714 |
| 14 | 2 | 0 | 0 | 0.42857 | 0.42857 | 0.14286 |
| 15 | 3 | 0 | 0 | 0.6 | 0.2 | 0.2 |
| 16 | 2 | 0 | 0 | 0.4 | 0.3 | 0.3 |
| 17 | 2 | 0 | 0 | 0 | 0.5 | 0.5 |
| 18 | 3 | 0 | 0 | 0 | 0 | 1 |
| 19 | 4 | 0 | 0 | 0 | 0 | 1 |
| 20 | 4 | 0 | 0 | 0 | 0 | 0 |

It will be appreciated that when comparing the probabilities of the symbols presented in the (tables) 'T2' and 'T4', the probabilities of those symbols that occur at the beginning of the data sequence are higher in the (table) 'T4' than in the (table) 'T2'. In other words, an implementation utilizing weighted frequencies not only facilitates more accurate probabilities of those symbols that occur at the end of the data sequence, but also facilitates more accurate probabilities of those symbols that occur at the beginning of the data sequence. Thus, implementations utilizing weighted frequencies potentially perform better than implementations utilizing non-weighted frequencies.

However, it is to be noted here that delivering the weighted frequencies to the given decoder also increases an overhead of data included in the encoded data (E2). As an example, for the implementation utilising non-weighted frequencies provided with respect to the (tables) 'T1' and 'T2', the frequencies of the symbols are delivered using 20 bits, namely four bits for each of the five symbols, in the encoded data (E2). For the implementation utilizing weighted frequencies provided with respect to the (tables) 'T3' and 'T4', the frequencies of the symbols are delivered using 35 bits, namely seven bits for each of the five symbols, in the encoded data (E2).

Optionally, the probabilities of the symbols are generated in another weighted manner, so as to not increase the overhead of data as much as compared to the implementation utilizing the non-weighted frequencies. As an example, the weights of the symbols can be divided by an integer, for example, such as '2', and rounded off to nearest integers.

In this manner, the aforementioned method is advantageously used to encode input data (D1) in which different symbols occur with different frequencies and are not uniformly distributed in the input data (D1). In particular, the aforementioned method is optimal in such cases where the probabilities of the symbols are known beforehand, but for certain symbols, the probabilities vary greatly at different positions in the input data (D1). As an example, if a probability for a given symbol were 0.2 for an entire given data sequence, but most occurrences of the given symbol were located at an end of the given data sequence, embodiments of the present disclosure would be especially effective.

Furthermore, in a table 'T5' below, there are presented the probabilities of the symbols when the same data sequence is encoded, but the probabilities are adaptively changed once for every four elements encoded. Thus, the method could be referred to, for example, as 'RangeAdapt4N'. Accordingly, the information indicative of the encoding method optionally includes a parameter 'RangeAdapt4N' to define the encoding method.

When the probabilities are not adaptively changed after each encoded element, the probability of the symbol '0', for example, will be zero later than in the previous example corresponding to the table 'T2'. However, as the computation of the probabilities is not performed after each encoded element, the computational burden is smaller for both the encoder and the corresponding decoder. This potentially leads to a more optimal implementation in some cases.

T5: Probabilities of Symbols as Computed after Encoding of Four Elements

| Number of Element Encoded | Symbol associated with Element Encoded | Probability of Symbol '0' | Probability of Symbol '1' | Probability of Symbol '2' | Probability of Symbol '3' | Probability of Symbol '4' |
|---|---|---|---|---|---|---|
| 0 |   | 0.2 | 0.05 | 0.5 | 0.1 | 0.15 |
| 1 | 0 | 0.2 | 0.05 | 0.5 | 0.1 | 0.15 |
| 2 | 1 | 0.2 | 0.05 | 0.5 | 0.1 | 0.15 |
| 3 | 0 | 0.2 | 0.05 | 0.5 | 0.1 | 0.15 |
| 4 | 2 | 0.125 | 0 | 0.5625 | 0.125 | 0.1875 |

| T5: Probabilities of Symbols as Computed after Encoding of Four Elements ||||||
|---|---|---|---|---|---|---|
| Number of Element Encoded | Symbol associated with Element Encoded | Probability of Symbol '0' | Probability of Symbol '1' | Probability of Symbol '2' | Probability of Symbol '3' | Probability of Symbol '4' |
| 5 | 0 | 0.125 | 0 | 0.5625 | 0.125 | 0.1875 |
| 6 | 0 | 0.125 | 0 | 0.5625 | 0.125 | 0.1875 |
| 7 | 2 | 0.125 | 0 | 0.5625 | 0.125 | 0.1875 |
| 8 | 2 | 0 | 0 | 0.58333 | 0.16667 | 0.25 |
| 9 | 4 | 0 | 0 | 0.58333 | 0.16667 | 0.25 |
| 10 | 2 | 0 | 0 | 0.58333 | 0.16667 | 0.25 |
| 11 | 2 | 0 | 0 | 0.58333 | 0.16667 | 0.25 |
| 12 | 2 | 0 | 0 | 0.5 | 0.25 | 0.25 |
| 13 | 2 | 0 | 0 | 0.5 | 0.25 | 0.25 |
| 14 | 2 | 0 | 0 | 0.5 | 0.25 | 0.25 |
| 15 | 3 | 0 | 0 | 0.5 | 0.25 | 0.25 |
| 16 | 2 | 0 | 0 | 0.25 | 0.25 | 0.5 |
| 17 | 2 | 0 | 0 | 0.25 | 0.25 | 0.5 |
| 18 | 3 | 0 | 0 | 0.25 | 0.25 | 0.5 |
| 19 | 4 | 0 | 0 | 0.25 | 0.25 | 0.5 |
| 20 | 4 | 0 | 0 | 0 | 0 | 0 |

In a table 'T6' below, there are presented the probabilities of the symbols when the same data sequence is encoded, but the probabilities are adaptively changed at an increasing rate as more elements are encoded. The computation of the probabilities is performed when 50% of the remaining elements have been encoded. In other words, the probabilities are first computed when ten elements have been encoded, and then computed when half of the remaining ten elements have been encoded, that is after next five elements, and so on. In this example, it can be seen that the probabilities are still clearly more optimal than constant probabilities, but the probabilities are adaptively changed only three times for this data sequence. The percentage of remaining elements after which the probabilities are computed is not limited to 50%, and can be any percentage value that lies in a range of 20% to 60%. This method could be referred to, for example, as 'RangeAdapt50P'. Accordingly, the information indicative of the encoding method optionally includes a parameter 'RangeAdapt50P' to define the encoding method. It will be appreciated that a value '50' can also be sent as a separate parameter and the method can be accordingly named as 'RangeAdaptP'.

| T6: Probabilities of Symbols as Computed after Encoding of 50% of Remaining Elements ||||||
|---|---|---|---|---|---|---|
| Number of Element Encoded | Symbol associated with Element Encoded | Probability of Symbol '0' | Probability of Symbol '1' | Probability of Symbol '2' | Probability of Symbol '3' | Probability of Symbol '4' |
| 0 |  | 0.2 | 0.05 | 0.5 | 0.1 | 0.15 |
| 1 | 0 | 0.2 | 0.05 | 0.5 | 0.1 | 0.15 |
| 2 | 1 | 0.2 | 0.05 | 0.5 | 0.1 | 0.15 |
| 3 | 0 | 0.2 | 0.05 | 0.5 | 0.1 | 0.15 |
| 4 | 2 | 0.2 | 0.05 | 0.5 | 0.1 | 0.15 |
| 5 | 0 | 0.2 | 0.05 | 0.5 | 0.1 | 0.15 |
| 6 | 0 | 0.2 | 0.05 | 0.5 | 0.1 | 0.15 |
| 7 | 2 | 0.2 | 0.05 | 0.5 | 0.1 | 0.15 |
| 8 | 2 | 0.2 | 0.05 | 0.5 | 0.1 | 0.15 |
| 9 | 4 | 0.2 | 0.05 | 0.5 | 0.1 | 0.15 |
| 10 | 2 | 0 | 0 | 0.6 | 0.2 | 0.2 |
| 11 | 2 | 0 | 0 | 0.6 | 0.2 | 0.2 |
| 12 | 2 | 0 | 0 | 0.6 | 0.2 | 0.2 |
| 13 | 2 | 0 | 0 | 0.6 | 0.2 | 0.2 |
| 14 | 2 | 0 | 0 | 0.6 | 0.2 | 0.2 |
| 15 | 3 | 0 | 0 | 0.4 | 0.2 | 0.4 |
| 16 | 2 | 0 | 0 | 0.4 | 0.2 | 0.4 |
| 17 | 2 | 0 | 0 | 0.4 | 0.2 | 0.4 |
| 18 | 3 | 0 | 0 | 0 | 0 | 1 |
| 19 | 4 | 0 | 0 | 0 | 0 | 1 |
| 20 | 4 | 0 | 0 | 0 | 0 | 0 |

It is to be noted here that the examples above are not the only ways in which the aforementioned method can adaptively compute the probabilities. As an example, the method can employ a combination of these ways, using weighting and adaptively changing the probabilities only after a certain percentage of the remaining elements has been encoded.

In a third aspect, embodiments of the present disclosure provide a decoder including data processing hardware for decoding encoded data (E2) to generate corresponding decoded data (D3), characterized in that the decoder is operable to regenerate at least one sequence of elements encoded into the encoded data (E2), wherein:

(i) the elements have corresponding symbols;
(ii) the at least one sequence of elements is regenerated from a first element thereof to a last element thereof;
(iii) the decoder is operable to receive information describing probabilities of symbols present in the at least one sequence of elements; and
(iv) the decoder is operable to adaptively change the probabilities of the symbols as the at least one sequence of elements is progressively decoded from the encoded data (E2).

It will be appreciated that when a given element of the at least one sequence is decoded from the encoded data (E2), the decoder is optionally operable to adaptively change the probabilities by:

(a) adaptively decreasing the probability of a symbol that corresponds to the given element of the at least one sequence, and
(b) adaptively increasing the probabilities of other symbols corresponding to remaining elements of the at least one sequence that are yet to be decoded.

It is to be noted here that instead of the probabilities of the symbols, the decoder can use the numbers of occurrences or ranges of the symbols, for example, as described earlier.

According to an embodiment of the present disclosure, the encoded data (E2) includes at least one of: encoded text data, encoded image data, encoded video data, encoded audio data, encoded biometric data, encoded genomic data, encoded medical measurement data, encoded sensor data, encoded data representative of at least one physical variable, encoded seismic data, encoded power consumption measurement data, and/or encoded surveillance data.

Examples of symbols include, but are not limited to, alphabetical characters, alphanumeric characters, numeric characters, and sequences thereof.

Moreover, the decoder is susceptible to being implemented using dedicated digital hardware, for example a field-programmable gate array (FPGA), and/or by using a data processor that is operable to execute program instructions. Optionally, the data processor is included in a portable wireless communication device, and the program instructions are provided to the device via one or more downloadable software applications, conventionally known as "Apps". Examples of the portable wireless communication device include, but are not limited to, a smart phone, a Mobile Internet Device (MID), a phablet computer, a tablet computer, an Ultra-Mobile Personal Computer (UMPC), a Personal Digital Assistant (PDA), a web pad, a handheld Personal Computer (PC) and a laptop computer.

According to an embodiment of the present disclosure, the information describing the probabilities includes information indicative of an encoding method employed at a corresponding encoder and information indicative of the numbers of occurrences of the symbols in an entirety of the at least one sequence. Thus, the information describing the probabilities describes a manner in which the probabilities are to be adaptively changed.

According to an embodiment of the present disclosure, the decoder is operable to receive the information describing the probabilities prior to receiving the encoded data (E2).

According to an embodiment of the present disclosure, the decoder is operable to receive the probabilities of the symbols in at least one of: a piece-wise manner and/or a delta manner.

Optionally, when the probabilities are received in a delta manner, the probabilities are indicated by way of decremental and/or incremental parameters.

Optionally, when the probabilities are received in a piece-wise manner, the probabilities are received sequentially piece-by-piece, for example as described earlier.

Optionally, the probabilities are received by way of a frequency table and/or a probability table.

Moreover, according to an embodiment of the present disclosure, the decoder is operable to compute the probabilities of the symbols in a weighted manner that is based upon characteristics of the symbols of the elements of the at least one sequence. Optionally, the decoder is operable to switch between different weighting regimes based upon the characteristics of the symbols of the elements of the at least one sequence. Optionally, the characteristics of the symbols correspond to one or more types of data present in the at least one sequence.

Optionally, the different weighting regimes are predetermined, and known to the decoder beforehand. Additionally or alternatively, optionally, the decoder is operable to receive information indicative of a used weighting regime, for example, together with the frequency table and/or the probability table.

Moreover, according to an embodiment of the present disclosure, the decoder is operable to decompress the encoded data (E2) when generating the decoded data (D3), such that the decoded data (D3) has a larger data size in comparison to the encoded data (E2).

Furthermore, according to an embodiment of the present disclosure, the decoder is operable to apply transcoding to the decoded data (D3). As an example, the decoder transcodes the decoded data (D3) when reformatting of the decoded data (D3) is required, for example, to be compatible with different types of communication platforms, software layers, communication devices, and so forth.

In a fourth aspect, embodiments of the present disclosure provide a method of decoding encoded data (E2) to generate corresponding decoded data (D3), via a decoder including data processing hardware, characterized in that the method includes regenerating at least one sequence of elements encoded into the encoded data (E2), wherein the elements have corresponding symbols, and wherein the method includes:

(i) regenerating the at least one sequence of elements from a first element thereof to a last element thereof; and
(ii) receiving information describing probabilities of symbols present in the at least one sequence of elements; and
(iii) adaptively changing the probabilities of the symbols as the at least one sequence of elements is progressively decoded from the encoded data (E2).

Optionally, when a given element of the at least one sequence is decoded from the encoded data (E2), the method includes adaptively changing the probabilities by:

(a) adaptively decreasing the probability of a symbol that corresponds to the given element of the at least one sequence, and
(b) adaptively increasing the probabilities of other symbols corresponding to remaining elements of the at least one sequence that are yet to be decoded.

It is to be noted here that instead of the probabilities of the symbols, the numbers of occurrences or ranges of the symbols can also be used.

According to an embodiment of the present disclosure, the encoded data (E2) includes at least one of: encoded text data, encoded image data, encoded video data, encoded audio data, encoded biometric data, encoded genomic data, encoded medical measurement data, encoded sensor data, encoded data representative of at least one physical variable, encoded seismic data, encoded power consumption measurement data, and/or encoded surveillance data.

Examples of symbols include, but are not limited to, alphabetical characters, alphanumeric characters, numeric characters, and sequences thereof.

According to an embodiment of the present disclosure, the information describing the probabilities includes information indicative of an encoding method employed at a corresponding encoder and information indicative of the numbers of occurrences of the symbols in an entirety of the at least one sequence. Thus, the information describing the probabilities describes a manner in which the probabilities are to be adaptively changed.

According to an embodiment of the present disclosure, the method includes receiving the information describing the probabilities prior to receiving the encoded data (E2).

According to an embodiment of the present disclosure, the method includes receiving the probabilities of the symbols in at least one of: a piece-wise manner and/or a delta manner.

Optionally, when the probabilities are received in a delta manner, the probabilities are indicated by way of decremental and/or incremental parameters.

Optionally, when the probabilities are received in a piece-wise manner, the probabilities are received sequentially piece-by-piece.

Optionally, the probabilities are received by way of a frequency table and/or a probability table.

Moreover, according to an embodiment of the present disclosure, the method includes computing the probabilities of the symbols in a weighted manner that is based upon characteristics of the symbols of the elements of the at least one sequence. Optionally, the method includes switching between different weighting regimes based upon the characteristics of the symbols of the elements of the at least one sequence. Optionally, the characteristics of the symbols correspond to one or more types of data present in the at least one sequence.

Optionally, the different weighting regimes are predetermined, and known to the decoder beforehand. Additionally or alternatively, optionally, the method includes receiving information indicative of a used weighting regime, for example, together with the frequency table and/or the probability table.

Moreover, according to an embodiment of the present disclosure, the method includes decompressing the encoded data (E2) when generating the decoded data (D3), such that the decoded data (D3) has a larger data size in comparison to the encoded data (E2).

Furthermore, according to an embodiment of the present disclosure, the method includes applying transcoding to the decoded data (D3). As an example, the decoded data (D3) is transcoded when reformatting of the decoded data (D3) is required, for example, to be compatible with different types of communication platforms, software layers, communication devices, and so forth.

In a fifth aspect, embodiments of the present disclosure provide a computer program product comprising a non-transitory computer-readable storage medium having computer-readable instructions stored thereon, the computer-readable instructions being executable by a computerized device comprising processing hardware to execute a method pursuant to the aforementioned second aspect.

Optionally, the computer-readable instructions are downloadable from a software application store, for example, from an "App store" to the computerized device.

In a sixth aspect, embodiments of the present disclosure provide a computer program product comprising a non-transitory computer-readable storage medium having computer-readable instructions stored thereon, the computer-readable instructions being executable by a computerized device comprising processing hardware to execute a method pursuant to the aforementioned fourth aspect.

Optionally, the computer-readable instructions are downloadable from a software application store, for example, from an "App store" to the computerized device.

In a seventh aspect, embodiments of the present disclosure provide a codec including at least one encoder for encoding input data (D1) to generate corresponding encoded data (E2) pursuant to the aforementioned first aspect, and at least one decoder for decoding the encoded data (E2) to generate corresponding decoded data (D3) pursuant to the aforementioned third aspect.

An example codec has been provided in conjunction with FIG. 1, as explained in more detail below. The codec includes at least one encoder for encoding input data (D1) to generate corresponding encoded data (E2), and at least one decoder for decoding the encoded data (E2) to generate corresponding decoded data (D3).

Optionally, the decoded data (D3) is exactly similar to the input data (D1), as in a lossless mode of operation. Alternatively, optionally, the decoded data (D3) is approximately similar to the input data (D1), as in a lossy mode of operation. Yet alternatively, optionally, the decoded data (D3) is different to the input data (D1), for example by way of a transformation, for example transcoding, but retains substantially similar information present in the input data (D1); for example, the decoded data (D3) is usefully made different to the input data (D1) when reformatting of the decoded data (D3) is also required, for example to be compatible with different types of communication platforms, software layers, communication devices, and so forth.

The at least one encoder includes data processing hardware for processing the input data (D1) to generate the corresponding encoded data (E2) pursuant to embodiments of the present disclosure. Optionally, the data processing hardware of the at least one encoder is implemented by employing at least one Reduced Instruction Set Computing (RISC) processor that is operable to execute program instructions as elucidated earlier.

Furthermore, optionally, the at least one encoder is operable to communicate the encoded data (E2) to a data server and/or data storage for storing in a database. The data server and/or data storage is arranged to be accessible to the at least one decoder, which is beneficially compatible with the at least one encoder, for subsequently decoding the encoded data (E2).

In some examples, the at least one decoder is optionally operable to access the encoded data (E2) from the data server and/or data storage.

In alternative examples, the at least one encoder is optionally operable to stream the encoded data (E2) to the at least one decoder, either via a communication network or via a direct connection. Moreover, it is to be noted that a device equipped with a hardware-based or software-based encoder can also communicate directly with another device equipped with a hardware-based or software-based decoder.

In yet other alternative examples, the at least one decoder is optionally implemented so as to retrieve the encoded data (E2) from a non-transitory (namely non-transient) computer-readable storage medium, such as a hard drive, an optical disc and/or a Solid-State Drive (SSD).

The at least one decoder includes a data processing hardware for processing the encoded data (E2) to generate the corresponding decoded data (D3) pursuant to embodiments of the present disclosure. Optionally, the data processing hardware of the at least one decoder is implemented by employing at least one RISC processor that is operable to execute program instructions as elucidated earlier; such a RISC processor is capable of performing relatively simpler concatenated operations at a very high speed, and is suitable for decoding data provided in a streamed format, for example in real-time.

When embodiments of the present disclosure are implemented in a multicasting manner, there is a plurality of such decoders that are employed.

Optionally, the at least one encoder and the at least one decoder are both present within a single device, for example for enabling bi-directional communication of the encoded data (E2) to be achieved. In such a case, the at least one encoder and the at least one decoder collectively constitute the codec.

Alternatively, optionally, the codec is effectively implemented between multiple devices. Optionally, the codec is implemented as custom-design digital hardware, for example via use of one or more Application-Specific Integrated Circuits (ASIC's). Alternatively or additionally, optionally, the codec is implemented using computing hardware that is operable to execute program instructions, for example provided to the computing hardware on a non-transient (non-transitory) machine-readable data carrier.

As an example, the at least one encoder and/or the at least one decoder can be beneficially employed in consumer electronics apparatus, wireless communication apparatus and associated systems, digital cameras, smart phones, tablet computers, personal computers, scientific measuring apparatus, communications equipment, videoconferencing equipment, satellites, but not limited thereto.

Next, embodiments of the present disclosure will be described with reference to figures.

Referring to FIG. 1, embodiments of the present disclosure concern:
(i) an encoder 10 for encoding input data (D1) to generate corresponding encoded data (E2), and corresponding methods of encoding the input data (D1) to generate the encoded data (E2);
(ii) a decoder 20 for decoding the encoded data (E2) to generate corresponding decoded data (D3), and corresponding methods of decoding the encoded data (E2) to generate the decoded data (D3); and
(iii) a codec 30 including a combination of at least one encoder and at least one decoder, for example a combination of the encoder 10 and the decoder 20.

FIG. 1 is merely an example, which does not unduly limit the scope of the claims herein. It is to be understood that the specific designation for the codec 30 is provided as an example and is not to be construed as limiting the codec 30 to specific numbers, types, or arrangements of encoders and decoders. A person skilled in the art will recognize many variations, alternatives, and modifications of embodiments of the present disclosure.

Embodiments of the present disclosure enable very efficient range coding to be achieved in the codec 30, when probabilities of symbols present in a data sequence are known before encoding is applied thereto. Optionally, in this regard, the probabilities of the symbols are determined by analysing the input data (D1) prior to encoding. Moreover, there is provided an improvement in efficiency of encoding of the input data (D1) compared to conventional methods that use fixed probabilities for symbols even when the symbols are not uniformly distributed.

Steps of a method of encoding the input data (D1) to generate the encoded data (E2), and steps of a method of decoding the encoded data (E2) to generate corresponding decoded data (D3) will be described in greater detail with reference to FIG. 2 and FIG. 3, respectively.

Figure 2:
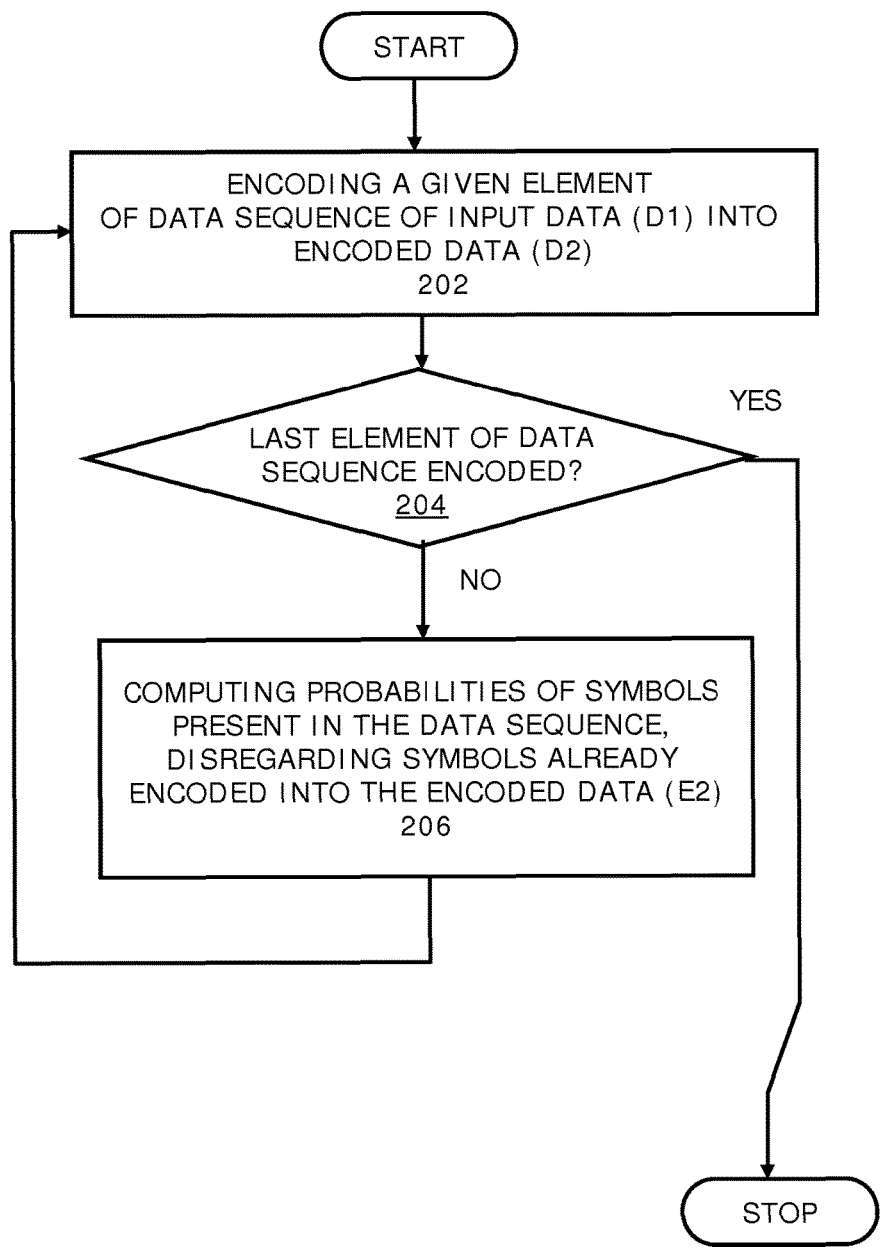
FIG. 2 is a schematic illustration of a flow chart depicting steps of a method of encoding input data (D1) to generate corresponding encoded data (E2), in accordance with an embodiment of the present disclosure.

Referring now to FIG. 2, there is provided a flow chart depicting steps of a method of encoding input data (D1) to generate corresponding encoded data (E2), in accordance with an embodiment of the present disclosure. The method is depicted as a collection of steps in a logical flow diagram, which represents a sequence of steps that can be implemented in hardware, software, or a combination thereof, for example as aforementioned.

At a step 202, a given element of a data sequence of the input data (D1) is encoded into the encoded data (E2).

At a step 204, it is checked whether or not the given element is a last element of the data sequence.

If, at the step 204, it is found that the given element is not the last element of the data sequence, a step 206 is performed. Otherwise, if it is found that the given element is the last element of the data sequence, the processing stops.

At the step 206, probabilities of symbols present in the data sequence are computed, whilst disregarding those elements of the data sequence that have already been encoded into the encoded data (E2). In accordance with the step 206, the probabilities of the symbols are adaptively changed as the data sequence is progressively encoded into the encoded data (E2).

After the step 206, the step 202 is repeated, wherein a next element of the data sequence is encoded into the encoded data (E2).

The steps 202 to 206 are only illustrative and other alternatives can also be provided where one or more steps are added, one or more steps are removed, or one or more steps are provided in a different sequence without departing from the scope of the claims herein.

Figure 3:
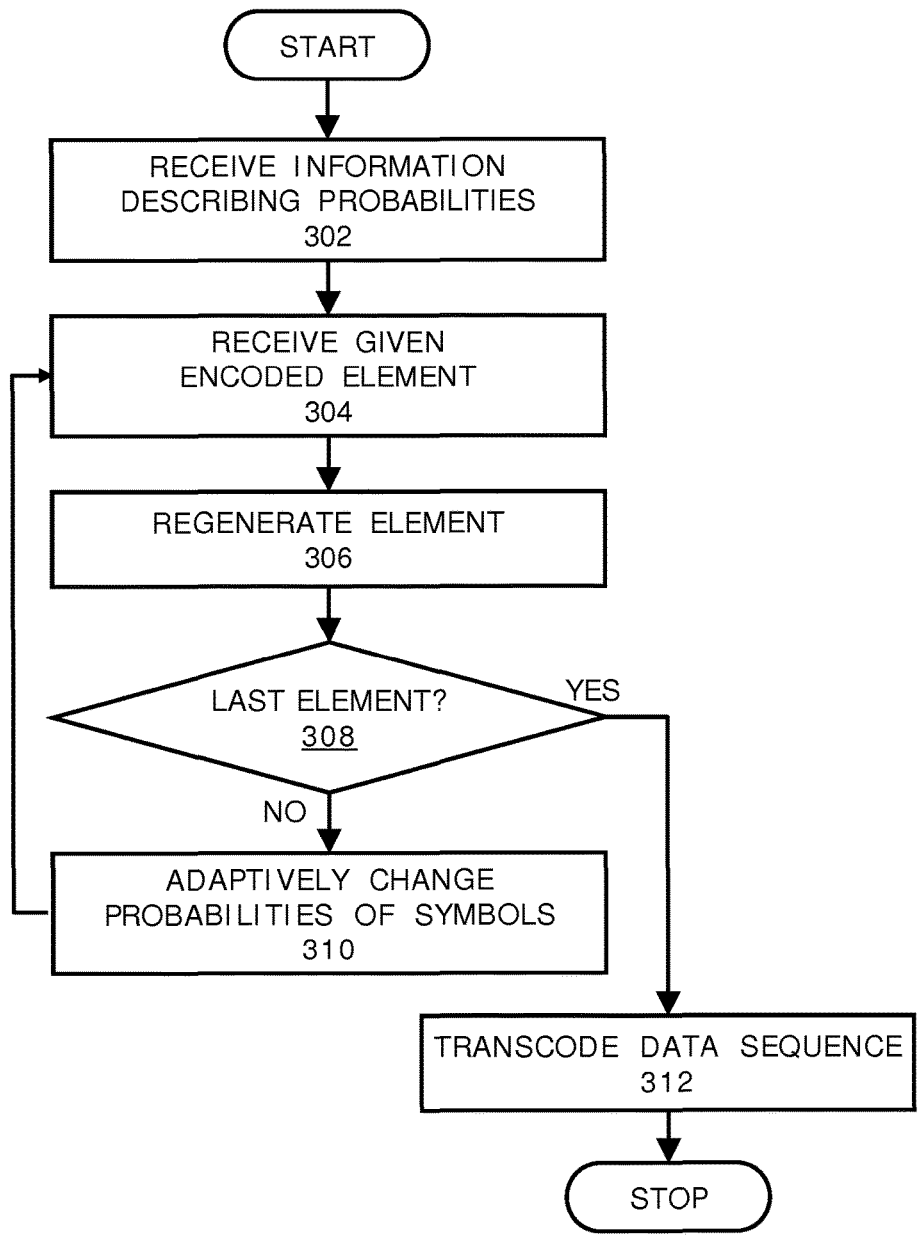
FIG. 3 is a schematic illustration of a flow chart depicting steps of a method of decoding encoded data (E2) to generate corresponding decoded data (D3), in accordance with an embodiment of the present disclosure.

Referring now to FIG. 3, there is provided a flow chart depicting steps of a method of decoding encoded data (E2) to generate corresponding decoded data (D3), in accordance with an embodiment of the present disclosure. The method is depicted as a collection of steps in a logical flow diagram, which represents a sequence of steps that can be implemented in hardware, software, or a combination thereof, for example as aforementioned.

At a step 302, information describing probabilities of symbols, present in a data sequence encoded into the encoded data (E2), is received.

At a step 304, a given encoded element of an encoded data sequence, included within the encoded data (E2), is received.

At a step 306, an element is regenerated corresponding to the given encoded element received at the step 304.

At a step 308, it is checked whether or not the given encoded element is a last element of the encoded data sequence.

If, at the step 308, it is found that the given encoded element is not the last element of the encoded data sequence, a step 310 is performed. At the step 310, the probabilities of the symbols are adaptively changed as the data sequence is progressively decoded from the encoded data sequence.

After the step 310, the step 304 is repeated, wherein a next encoded element of the encoded data sequence is received.

If, at the step 308, it is found that the given encoded element is the last element of the encoded data sequence, an optional step 312 is performed. At the optional step 312, the data sequence is transcoded, when reformatting of the decoded data (D3) is required, for example to be compatible with a different type of a communication platform, a software layer, a communication device, and so forth.

The steps 302 to 312 are only illustrative and other alternatives can also be provided where one or more steps are added, one or more steps are removed, or one or more steps are provided in a different sequence without departing from the scope of the claims herein.

Modifications to embodiments of the invention described in the foregoing are possible without departing from the scope of the invention as defined by the accompanying claims. Expressions such as "including", "comprising", "incorporating", "consisting of", "have", "is" used to describe and claim the present invention are intended to be construed in a non-exclusive manner, namely allowing for items, components or elements not explicitly described also to be present. Reference to the singular is also to be construed to relate to the plural. Numerals included within parentheses in the accompanying claims are intended to assist understanding of the claims and should not be construed in any way to limit subject matter claimed by these claims.

We claim:

1. An encoder including data processing hardware for encoding input data to generate corresponding encoded data, characterized in that the encoder is operable to process at least one sequence of elements in the input data, wherein:
   (i) the elements have corresponding symbols;
   (ii) the at least one sequence of elements is processed from a first element thereof to a last element thereof;
   (iii) the encoder is operable to compute probabilities of symbols present in the at least one sequence of elements, wherein the probabilities of the symbols are computed whilst disregarding those elements of the at least one sequence that have already been encoded into the encoded data, and wherein the probabilities of the symbols used by the encoder for generating the encoded data are adaptively changed as the at least one sequence of elements is progressively encoded into the encoded data; and
   (iv) the encoder is operable to deliver information describing the probabilities of the symbols.

2. An encoder as claimed in claim 1, characterized in that when a given element of the at least one sequence is encoded into the encoded data, the encoder is operable to adaptively change the probabilities by:
   (a) adaptively decreasing the probability of a symbol that corresponds to the given element, and
   (b) adaptively increasing the probabilities of other symbols corresponding to remaining elements of the at least one sequence that are yet to be encoded.

3. An encoder as claimed in claim 1, characterized in that the information describing the probabilities describes a manner in which the probabilities are adaptively changed.

4. An encoder as claimed in claim 1, characterized in that the encoder is operable to deliver the information describing the probabilities prior to delivering the encoded data.

5. An encoder as claimed in claim 1, characterized in that the encoder is operable to compute the probabilities of the symbols in a weighted manner that is determined based upon characteristics of the symbols of the elements of the at least one sequence.

6. An encoder as claimed in claim 1, characterized in that the encoder is operable to deliver the probabilities of the symbols in at least one of: a piece-wise manner and/or a delta manner.

7. An encoder as claimed in claim 1, characterized in that the encoder is operable to compress the input data when generating the encoded data, such that the encoded data has a smaller data size in comparison to the input data.

8. An encoder as claimed in claim 1, characterized in that the input data includes at least one of: text data, image data, video data, audio data, biometric data, genomic data, medical measurement data, sensor data, data representative of at least one physical variable, seismic data, power consumption measurement data, surveillance data.

9. A decoder including data processing hardware for decoding encoded data to generate corresponding decoded data, characterized in that the decoder is operable to regenerate at least one sequence of elements encoded into the encoded data, wherein:
   (i) the elements have corresponding symbols;
   (ii) the at least one sequence of elements is regenerated from a first element thereof to a last element thereof;
   (iii) the decoder is operable to receive information describing probabilities of symbols present in the at least one sequence of elements; and
   (iv) the decoder is operable to adaptively change the probabilities of the symbols as the at least one sequence of elements is progressively decoded from the encoded data.

10. A method of encoding input data to generate corresponding encoded data, via an encoder including data processing hardware, characterized in that the method includes processing at least one sequence of elements in the input data, wherein the elements have corresponding symbols, and wherein the method includes:
    (i) processing the at least one sequence of elements from a first element thereof to a last element thereof;
    (ii) computing probabilities of symbols present in the at least one sequence of elements, wherein the probabilities of the symbols are computed whilst disregarding those elements of the at least one sequence that have already been encoded into the encoded data, and wherein the probabilities of the symbols used for generating the encoded data are adaptively changed as the at least one sequence of elements is progressively encoded into the encoded data; and
    (iii) delivering information describing the probabilities of the symbols.

11. A method as claimed in claim 10, characterized in that when a given element of the at least one sequence is encoded into the encoded data, the method includes adaptively changing the probabilities by:
    (a) adaptively decreasing the probability of a symbol that corresponds to the given element, and
    (b) adaptively increasing the probabilities of other symbols corresponding to remaining elements of the at least one sequence that are yet to be encoded.

12. A method as claimed in claim 10, characterized in that the information describing the probabilities describes a manner in which the probabilities are adaptively changed.

13. A method as claimed in claim 10, characterized in that the method includes delivering the information describing the probabilities prior to delivering the encoded data.

14. A method as claimed in claim 10, characterized in that the method includes computing the probabilities of the symbols in a weighted manner that is determined based upon characteristics of the symbols of the elements of the at least one sequence.

15. A method as claimed in claim 10, characterized in that the method includes delivering the probabilities of the symbols in at least one of: a piece-wise manner and/or a delta manner.

16. A method as claimed in claim 10, characterized in that the method includes compressing the input data when generating the encoded data, such that the encoded data has a smaller data size in comparison to the input data.

17. A method as claimed in claim 10, characterized in that the input data includes at least one of: text data, image data, video data, audio data, biometric data, genomic data, medical measurement data, sensor data, data representative of at least one physical variable, seismic data, power consumption measurement data, surveillance data.

18. A computer program product comprising a non-transitory computer-readable storage medium having computer-readable instructions stored thereon, the computer-readable instructions being executable by a computerized device comprising processing hardware to execute a method as claimed in claim 10.

19. A codec including at least one encoder as claimed in claim 1, and at least one decoder as claimed in claim 9.

20. A decoder as claimed in claim 9, characterized in that when a given element of the at least one sequence is decoded from the encoded data, the decoder is operable to adaptively change the probabilities by:
　(a) adaptively decreasing the probability of a symbol that corresponds to the given element of the at least one sequence, and
　(b) adaptively increasing the probabilities of other symbols corresponding to remaining elements of the at least one sequence that are yet to be decoded.

21. A decoder as claimed in claim 9, characterized in that the information describing the probabilities describes a manner in which the probabilities are to be adaptively changed.

22. A decoder as claimed in claim 9, characterized in that the decoder is operable to receive the information describing the probabilities prior to receiving the encoded data.

23. A decoder as claimed in claim 9, characterized in that the decoder is operable to compute the probabilities of the symbols in a weighted manner that is based upon characteristics of the symbols of the elements of the at least one sequence.

24. A decoder as claimed in claim 9, characterized in that the decoder is operable to receive the probabilities of the symbols in at least one of: a piece-wise manner and/or a delta manner.

25. A decoder as claimed in claim 9, characterized in that the decoder is operable to decompress the encoded data when generating the decoded data, such that the decoded data has a larger data size in comparison to the encoded data.

26. A decoder as claimed in claim 9, wherein the decoder is operable to apply transcoding to the decoded data.

27. A decoder as claimed in claim 9, characterized in that the encoded data includes at least one of: encoded text data, encoded image data, encoded video data, encoded audio data, encoded biometric data, encoded genomic data, encoded medical measurement data, encoded sensor data, encoded data representative of at least one physical variable, encoded seismic data, encoded power consumption measurement data, encoded surveillance data.

28. A method of decoding encoded data to generate corresponding decoded data, via a decoder including data processing hardware, characterized in that the method includes regenerating at least one sequence of elements encoded into the encoded data, wherein the elements have corresponding symbols, and wherein the method includes:
　(i) regenerating the at least one sequence of elements from a first element thereof to a last element thereof;
　(ii) receiving information describing probabilities of symbols present in the at least one sequence of elements; and
　(iii) adaptively changing the probabilities of the symbols as the at least one sequence of elements is progressively decoded from the encoded data.

29. A method as claimed in claim 28, characterized in that when a given element of the at least one sequence is decoded from the encoded data, the method includes adaptively changing the probabilities by:
　(a) adaptively decreasing the probability of a symbol that corresponds to the given element of the at least one sequence, and
　(b) adaptively increasing the probabilities of other symbols corresponding to remaining elements of the at least one sequence that are yet to be decoded.

30. A method as claimed in claim 28, characterized in that the information describing the probabilities describes a manner in which the probabilities are to be adaptively changed.

31. A method as claimed in claim 28, characterized in that the method includes receiving the information describing the probabilities prior to receiving the encoded data.

32. A method as claimed in claim 28, characterized in that the method includes computing the probabilities of the symbols in a weighted manner that is based upon characteristics of the symbols of the elements of the at least one sequence.

33. A method as claimed in claim 28, characterized in that the method includes receiving the probabilities of the symbols in at least one of: a piece-wise manner and/or a delta manner.

34. A method as claimed in claim 28, characterized in that the method includes decompressing the encoded data when generating the decoded data, such that the decoded data has a larger data size in comparison to the encoded data.

35. A method as claimed in claim 28, wherein the method includes applying transcoding to the decoded data.

36. A method as claimed in claim 28, characterized in that the encoded data includes at least one of: encoded text data, encoded image data, encoded video data, encoded audio data, encoded biometric data, encoded genomic data, encoded medical measurement data, encoded sensor data, encoded data representative of at least one physical variable, encoded seismic data, encoded power consumption measurement data, encoded surveillance data.

37. A computer program product comprising a non-transitory computer-readable storage medium having computer-readable instructions stored thereon, the computer-readable instructions being executable by a computerized device comprising processing hardware to execute a method as claimed in claim 28.

* * * * *